Oct. 9, 1951 E. I. ANDERSON 2,571,001

CONVERTER CIRCUITS FOR FREQUENCY MODULATION-AMPLITUDE MODULATION RECEIVERS

Filed Dec. 4, 1945 2 Sheets-Sheet 1

INVENTOR
EARL I. ANDERSON
BY H. S. Grover
ATTORNEY

Oct. 9, 1951 E. I. ANDERSON 2,571,001

CONVERTER CIRCUITS FOR FREQUENCY MODULATION-AMPLITUDE MODULATION RECEIVERS

Filed Dec. 4, 1945 2 Sheets-Sheet 2

INVENTOR
EARL I. ANDERSON
BY
H. S. Grover
ATTORNEY

Patented Oct. 9, 1951 2,571,001

UNITED STATES PATENT OFFICE 2,571,001

CONVERTER CIRCUITS FOR FREQUENCY MODULATION-AMPLITUDE MODULATION RECEIVERS

Earl I. Anderson, Manhasset, N. Y., assignor to Radio Corporation of America, a corporation of Delaware Application December 4, 1945, Serial No. 632,728

4 Claims. (Cl. 250—36)

My present invention relates generally to converter circuits for multi-band superheterodyne receivers, and more particularly to pentagrid converter circuits which are capable of efficient operation in the two or more frequency bands of a combined FM-AM receiver.

The problem of switching the pentagrid converter for operation in both the FM band (88–108 mc.) and the AM broadcast band (550–1600 kc.) involves several difficulties. If the oscillator section of the converter is of the Hartley type it becomes necessary to switch both the cathode and grid circuits. The amount of inductance required in the cathode circuit at the very high frequencies involved in the FM band is so small that with the switch included in the cathode circuit the inductance due to the switch alone would be too large.

It is therefore a main object of the invention to provide in a combined AM-FM receiver a pentagrid converter system, in which for high frequencies the band-switch is entirely eliminated from the cathode circuit. I accomplish this and other objects of the invention by utilizing an oscillator of the Colpitts type at the frequencies in the FM band and an oscillator of the Hartley type at the frequencies in the AM broadcast band.

Other objects and advantages of the invention will best be understood by a consideration of the following description taken together with the accompanying drawing, in which.

Figure 1:
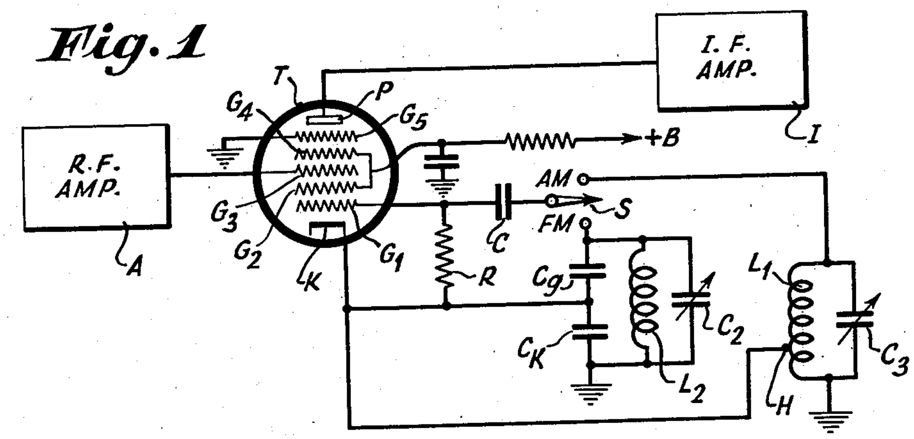
Fig. 1 is a pentagrid converter system in accordance with one form of the present invention.

Referring first to Fig. 1, the tube shown at T is a pentagrid converter having a cathode K, a plurality of grids, $G_1$ to $G_5$, and an anode or plate P and may be of the type known as the 6SA7. A source of signals such as a radio frequency amplifier A is connected to the signal control grid $G_3$, and to the anode P is connected an amplifier I of the intermediate frequencies resulting from the frequency conversion within the tube.

The oscillator section of the tube is constituted by cathode K, first grid $G_1$ and second grid $G_2$ which serves as the anode of the oscillator. The oscillator for the FM band is of the Colpitts type and its frequency-determining circuit is constituted by an inductance $L_2$, a variable tuning condenser $C_2$ shunted across the inductance, and a pair of series-connected condensers $C_g$, $C_k$ also shunted across the inductance. For high frequencies the cathode is connected to the frequency-determining circuit $L_2$—$C_2$—$C_g$—$C_k$ at the common terminal between the series-connected condensers $C_g$ and $C_k$. The low potential side of the circuit is grounded and the high potential side is connected to a switch terminal marked FM. The first or oscillator grid $G_1$ is adapted to be connected to the circuit $L_2$—$C_2$—$C_g$—$C_k$ through a grid blocking condenser C and a band-switch S when in contact with switch terminal FM. A grid leak R is connected between the cathode K and the oscillator grid $G_1$.

The oscillator for the AM broadcast band is of the Hartley type and its frequency-determining circuit for the AM is constituted by an inductance $L_1$ and a shunt variable tuning condenser $C_3$. The high potential side of circuit $L_1$—$C_3$ is connected to a switch terminal marked AM and the low potential side of the circuit is connected to ground. The coil $L_1$ is provided with a tap at H to which the cathode K is connected.

In the FM switch-position the DC cathode return is through the tapped portion (between tap H and ground) of the broadcast band coil $L_1$. Since the cathode is tapped up about $\frac{1}{10}$ of the way on the coil, the FM capacities $C_g$, $C_k$ and $C_2$ will appear as one-hundredth of their values across coil $L_1$ and therefore will not affect operation of the oscillator in the AM band.

Figure 2:
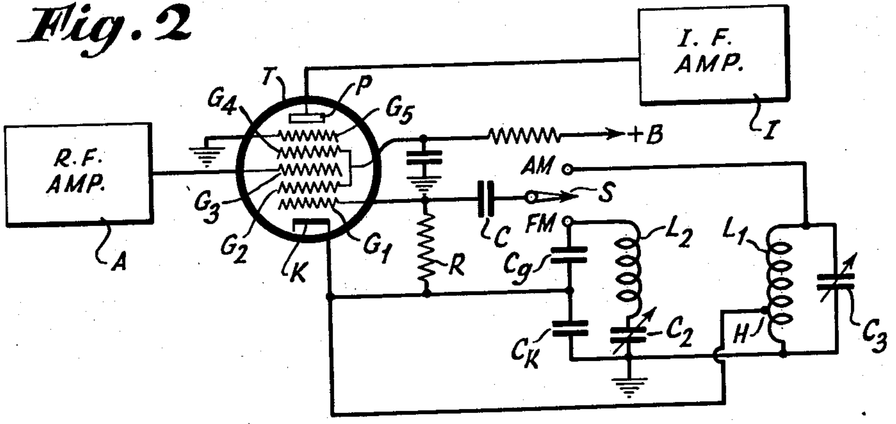
Figs. 2 and 3 are other embodiments of the invention.

In Fig. 2 there is shown a converter circuit which is similar to that shown in Fig. 1 except that the FM oscillator circuit utilizes a modified Colpitts circuit in which $L_2$ and $C_2$ are connected in series to constitute a net variable inductive reactance which resonates with $C_g$, $C_k$ and the tube capacitances.

Figure 3:
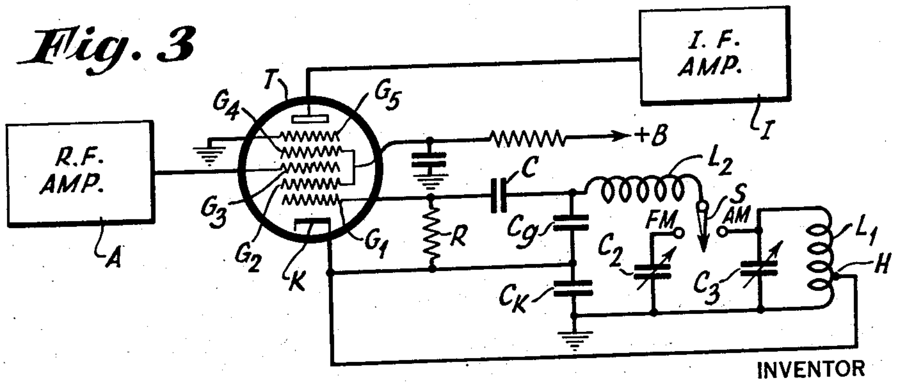

The converted circuit shown in Fig. 3 is still a further modification in which the band-switch S is connected to the high frequency or FM coil $L_2$ and is generally similar to the tunable circuits shown in Fig. 5 of my application, Ser. No. 632,727 filed concurrently herewith, now U. S. Patent No. 2,561,087.

Figure 4:
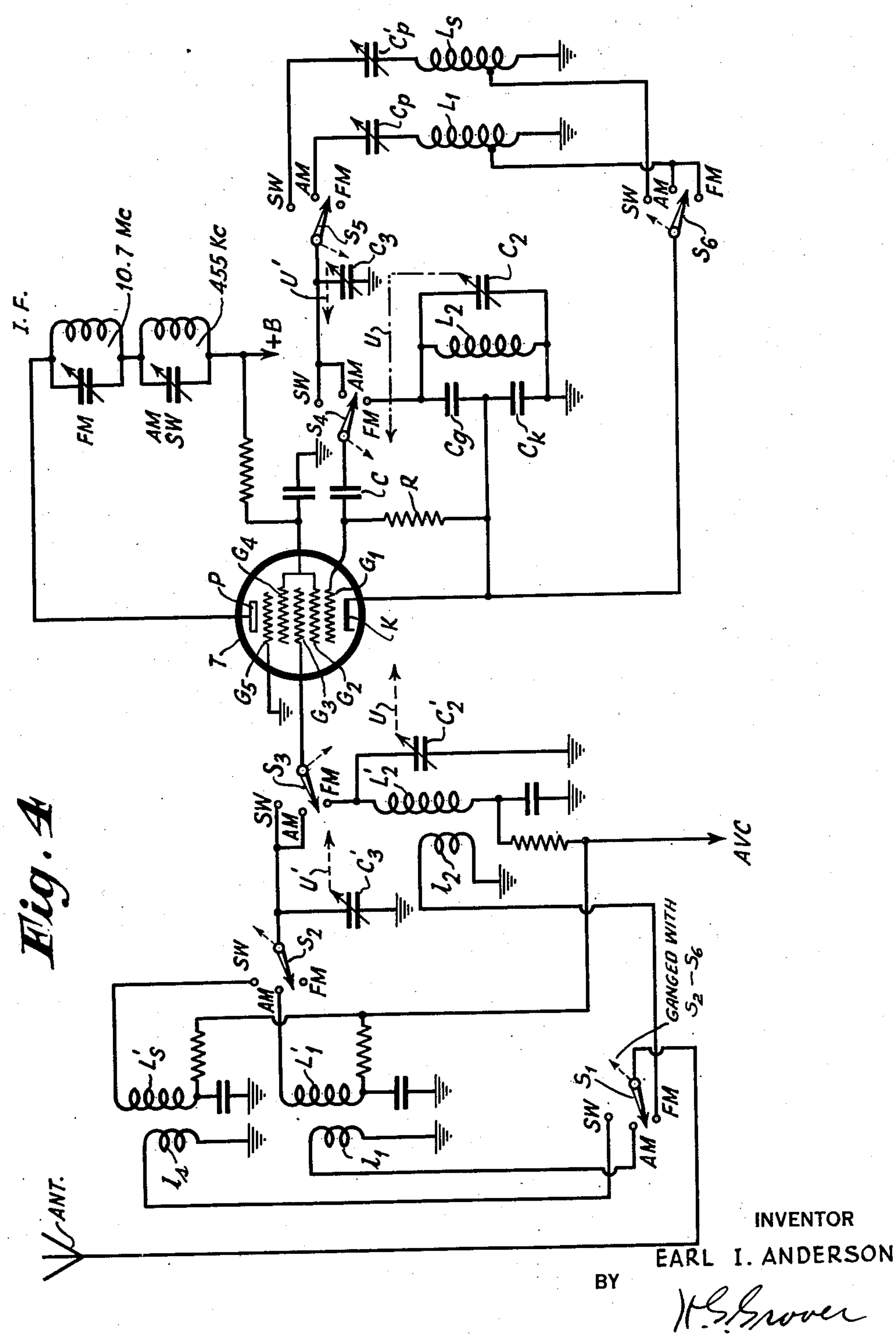
Fig. 4 is a practical pentagrid converter circuit for a receiver designed for reception in a short-wave AM band, in addition to the FM and AM broadcast bands.

In Fig. 4 the converter system of Fig. 1 is adapted for use in an additional band which may be a short-wave band. For operation in the FM band, the oscillator circuit is the same as in Fig. 1, band-switch $S_4$ corresponding to switch S in Fig. 1. Variable condenser $C_3$ is the tuning element for both the AM and short-wave bands and is adapted, by means of a band-switch $S_5$, to be connected across coil $L_1$ and series padding condenser $C_p$ for operation in the AM band and across coil $L_s$ and series padding condenser $C'_p$ for operation in the short-wave band. The cathode of tube T is connected to a band-switch $S_6$ to return the cathode to ground through a tapped portion of $L_1$ for operation in the AM and FM bands and through a tapped portion of $L_s$ for operation in the short-wave band.

In the FM band a switch $S_3$ connects a parallel resonant circuit $L'_2$—$C'_2$ to the signal control grid $G_3$, the tuning condenser $C'_2$ of this circuit being arranged for unicontrol operation with the tuning condenser $C_2$ of the oscillator by suitable means represented by the chain line U. A switch $S_2$ serves to connect a short-wave coil $L'_s$ across a tuning condenser $C'_3$ for operation in the short-wave band and a coil $L'_1$ across the same tuning condenser for operation in the AM band, the appropriate tunable circuit for these two bands being connected to the signal control grid by way of the band-switch $S_3$. Tuning condensers $C'_3$ and $C_3$ are arranged for unicontrol operation by suitable means represented by the dash line U'. A band-switch $S_1$, which is arranged for unicontrol operation along with the switches $S_2$ to $S_6$, serves to selectively connect the appropriate coupling coil $l_1$, $l_2$ or $l_3$ to the antenna ANT, or other source of signal energy, for operation in the various bands.

While I have shown and described certain preferred embodiments of my invention it will be understood that various modifications and changes will occur to those skilled in the art without departing from the spirit and scope of this invention.

What I claim is:

1. A converter system for a combined AM-FM superheterodyne receiver comprising a tube having a cathode and first and second grids which constitute the electrodes of the oscillator section of the converter, a first oscillator frequency-determining circuit of the Colpitts type, a second oscillator frequency-determining circuit of the Hartley type, a direct connection from the cathode to each of said circuits, a connection from the second grid to a terminal of each of said circuits, and a single switch connected to the first grid for selectively connecting one of said circuits to be effective in the AM band and the other of said circuits to be effective in the FM band.

2. A converter system for a combined AM-FM superheterodyne receiver comprising a tube having a cathode and first and second grids which constitute oscillator electrodes, a first oscillator frequency-determining circuit of the Colpitts type, a second oscillator frequency-determining circuit of the Hartley type, each having a ground connection at one end and a switch contact at the other end, a direct connection from the cathode to each of said circuits, a connection from the second grid to said ground connection, and a switch connected to the first grid and adapted for selective cooperation with said switch contacts to connect into circuit one or the other of said frequency-determining circuits, said switch constituting the only switch of the converter system.

3. A converter system for a combined AM-FM superheterodyne receiver comprising a tube having a cathode and first and second grids which constitute oscillator electrodes, a first oscillator frequency-determining circuit of the Colpitts type, a second oscillator frequency determining circuit of the Hartley type, a direct connection from the cathode to the common terminal of the series-connected condensers included in the Colpitts circuit, a direct connection from the cathode to a tap on the coil of the Hartley circuit, a further connection from the second grid to a terminal of the Hartley and of the Colpitts circuit, and a switch connected to the first grid adapted to selectively connect into circuit the Colpitts circuit for operation in the FM band and the Hartley circuit for operation in the AM band.

4. A converter system for a multi-band superheterodyne receiver comprising; a tube having a cathode, a first grid, and a second grid; a first resonant circuit of the Colpitts type having a pair of end terminals and an intermediate terminal; a second resonant circuit of the Hartley type having a pair of end terminals and an intermediate terminal; a direct connection from said cathode to said intermediate terminals; a connection from said second grid to one of said end terminals of each of said resonant circuits; and a switch connected to said first grid and adapted to selectively connect said first grid to the other end terminal of one of said resonant circuits.

EARL I. ANDERSON.

REFERENCES CITED

The following references are of record in the file of this patent:

UNITED STATES PATENTS

| Number | Name | Date |
|---|---|---|
| 1,624,537 | Colpitts | Apr. 12, 1927 |
| 1,976,570 | Llewellyn | Oct. 9, 1934 |
| 2,354,959 | McCoy | Aug. 1, 1944 |
| 2,443,935 | Shea | June 22, 1948 |

FOREIGN PATENTS

| Number | Country | Date |
|---|---|---|
| 487,700 | Great Britain | June 24, 1938 |